United States Patent [19]

Connery

[11] Patent Number: 4,573,574

[45] Date of Patent: Mar. 4, 1986

[54] AXIAL LEAD COMPONENT PACKAGE WITH WAX RETAINING MECHANISM

[76] Inventor: Colin A. Connery, c/o SALSA, P.O. Box 1296, New York, N.Y. 10009

[21] Appl. No.: 624,286

[22] Filed: Jun. 25, 1984

[51] Int. Cl.⁴ .............................................. B65D 73/02
[52] U.S. Cl. ................................... 206/328; 206/331; 206/332; 206/382; 206/383; 206/459
[58] Field of Search ............... 206/328, 331, 332, 334, 206/380, 382, 459

[56] References Cited

U.S. PATENT DOCUMENTS

| | | | |
|---|---|---|---|
| 616,042 | 12/1898 | Walsh | 206/367 |
| 3,004,660 | 10/1961 | Hofmann | 206/382 |
| 3,191,791 | 6/1965 | Jackson | 206/328 |
| 3,469,687 | 9/1969 | Schneider | 206/382 |
| 4,457,430 | 7/1984 | Darling et al. | 206/459 |

*Primary Examiner*—Joseph Man-Fu Moy
*Attorney, Agent, or Firm*—Clement and Ryan

[57] ABSTRACT

A multi-compartment container for storing and dispensing axial lead components in which the components are oriented at a right angle with respect to the open face of the container. The components are anchored in the compartments by imbedding the component leads in a layer of wax.

2 Claims, 3 Drawing Figures

AXIAL LEAD COMPONENT PACKAGE WITH WAX RETAINING MECHANISM

BACKGROUND OF THE INVENTION

This invention concerns means for storing and dispensing axial lead components.

Axial lead components are the most common type of component used in electronic circuits. Each component provides a preset, fixed value of a desired parameter such as resistance, capacitance or inductance. Typically, in each package configuration there are found hundreds of different values of resistance, or other parameter, distinguished from each other by color coding imprinted on the body of the component. Often the user will need rapid access to a particular value of component.

The most convenient means for accessing a particular value is to store and dispense the components from a grid of open cells (compartments) such that each cell contains a single value of component and each cell is held in a fixed two-dimensional relationship with the other cells so that a particular value of component can be quickly located by row and column. With an open cell array of this kind, the user need only reach into the appropriate cell to retrieve the desired component.

There are several problems associated with open cell arrays. One limitation is that the volumetric efficiency of an open cell array is not nearly so good as can be realized with mixed storage in which many values of components are mixed together in a single container.

Another problem associated with the open cell array is the danger of component spilling and component mixing. A means for minimizing these two problems entails the use of "closed cells."

However, the need to open and reseal each cell in the course of retrieving a component detracts from the convenience of closed cell dispensers. The sealing mechanism for the individual cells also adds to the cost, bulk and complexity of the dispenser.

OBJECT OF THE INVENTION

My invention is an improved open cell array for storing and dispensing axial lead components. The dispenser provides rapid access to any desired value of component. It is compact, rugged and completely immune to accidental spilling or mixing. In addition, in its preferred form my invention makes possible the rapid and precise measurement of the degree to which the dispenser has been depleted by use, and also can be adapted to reliably detect and record any unauthorized attempt to tamper with its contents.

SUMMARY OF THE INVENTION

The component container of this invention is designed for storing a plurality of axial lead components and for dispensing the same individually, as desired. The plurality of components with which the container can be advantageously used includes at least two portions, and ordinarily many more than two portions.

Each of the portions of the plurality of components to be stored in the container includes only components having a selected parameter (such as resistance, capacitance or inductance) of a particular predetermined value. The components in the other portions of the plurality of components stored in the container all have a different predetermined value of that selected parameter.

The plurality of components to be stored may include, for example, resistors divided into one portion having a first value of resistance, a second portion having a second value, and so forth. Or, if desired, the components to be stored may include such portions of resistors and a plurality of portions of diodes, each of which portions is restricted to a certain value of a selected parameter for the respective type of component. Even a larger variety of types of components may be stored in the container when necessary, with each type being divided according to the various values of a selected parameter for that type.

All of the components have substantially the same length, including the axial leads at both ends of each component.

The container comprises a rectangular box, open on one face and partitioned into a plurality of elongated cells at least equal in number to the number of the aforementioned portions of the plurality of components being stored.

The elongated cells are parallel to each other and at a right angle to the open face of the box. The cells are open at their top ends adjacent to the open face of the box. The opening to each cell preferably has a maximum diagonal measurement that is substantially less than the length of the components stored in the cell.

The depth of each cell is approximately equal to the length of the stored components. Each cell is filled to a predetermined depth at its closed, bottom end with a wax or wax-like substance that is meltable to permit a component lead to be inserted therein to retain the component in the cell after said wax or wax-like substance is solidified around the lead in contact therewith throughout the entire portion thereof that has been inserted within said melted material. Each component thus retained in the container is removable manually by gripping the upper lead of the component with a suitable tool held in the user's hand.

The present invention also includes the combination of a container with a plurality of axial lead components, both as described above.

As will be seen, first novel element of the container of this invention is a cell configured to contain the axial components at a right angle with respect to the plane defined by the open face of the array. Although it is the common practice to orient the components so that they are parallel to the open face, there are several good reasons for departing from this convention.

First of all, the right angle orientation makes possible a much smaller opening to each cell since the opening is no longer required to accommodate the full length of the component. As a result, many more cells may be contained in an array of fixed dimensions.

Secondly, the leads of individual components are much less likely to become entangled. The practical consequence is that entangled components rarely, if ever, are accidentally thrown into adjoining cells as a result of hasty component removal. It is also noteworthy that the vertical orientation minimizes the danger of components rolling into adjoining cells as a result of the sloshing or tilting of the array.

The principal disadvantage of the right angle orientation is the inability of the user to examine the color coding on the bodies of the components. This is an important consideration if accidental component mixing is a frequent occurrence. However, as already noted, the right angle orientation minimizes this problem.

Another concern is the difficulty associated with grasping component leads by their tips with the fingers. Fortunately, anyone using axial lead components will almost certainly have in their possession a pair of needle nose pliers, which is the ideal tool for assisting in component removal.

A second element of novelty is the provision of a means for retaining the components in their cells.

In contrast to other bonding mechanisms, I have found that wax or a wax-like substance is ideal for this purpose.

A layer of wax into which the leads of the components are imbedded having a thickness which is typically one tenth (or more) of the length of the components will securely retain every component while still permitting, with the aid of a pair of needle nose pliers by which the upper lead of the component may be gripped, the convenient removal of individual components.

The tangible thickness of the wax layer insures that, with the preferred embodiment of this container in which the maximum diagonal dimension of the opening at the top of each cell is substantially less than the overall length of a component, individual components which accidentally fall into the wrong cell will protrude above their neighbors by an amount at least equal to the thickness of the wax layer and thus will be easy to locate and retrieve.

Because the wax can be melted and solidified at will, it is possible to load and reload the container as often as desired. As will be apparent from a comparison of FIGS. 1 and 2 of the drawing, after the wax layer at the bottom of each cell is melted, the component lead can be inserted in the melted material, where it is retained after the material is solidified around the lead in contact with the lead throughout the entire portion thereof that has been inserted within the melted material.

The fact that loading the container requires the elevation of the temperature of the box provides a simple means for monitoring the integrity of the component collection. This is done by affixing a "one-shot" (irreversible) temperature indicator to the outside, and typically to the bottom, of the container adjacent to the wax layer. Any unauthorized attempt to melt the wax and tamper with the contents of the box will then be recorded.

The extent to which the container has been depleted by component removal can be accurately measured by comparing the weight of the container before and after use. The accuracy and reliability of this measurement is assured because my invention makes it possible to invert the container and shake out all loose foreign matter while the temperature indicator insures detection of any attempt to alter the weight of the container by embedding foreign matter in the wax.

DESCRIPTION OF THE PREFERRED EMBODIMENT

Figure 1:
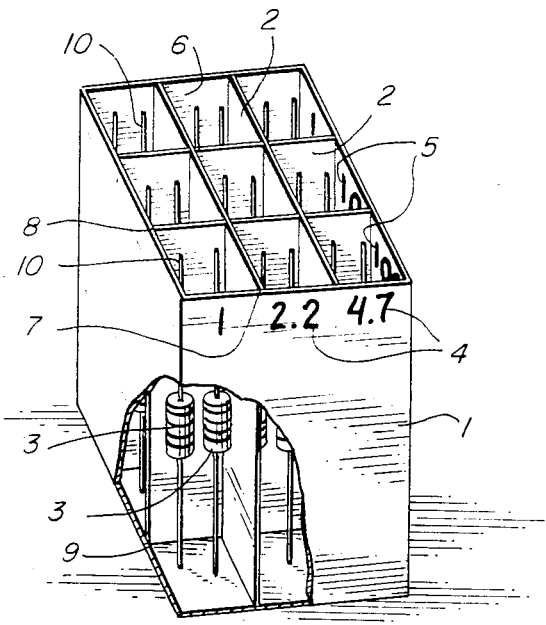
FIG. 1 is a three-quarter perspective view from the top of a device in accordance with the invention, with portions of the side walls removed to expose a portion of the internal structure of the device.

In FIG. 1 the device is comprised of three elements: an open ended rectangular box 1, a grid of flat, rectangular partitioning members 2, and the axial lead components 3 contained in the cells created by the partitioning members 2.

The parameter value of the components 3 assigned to each cell may be given in row and column format by assigning significant numbers to columns 4 and multipliers to rows 5. Alternatively, the partition members 2 might be color coded in agreement with the color coding on the components 3. Also, it is possible to label the partition members 2 and the interior box walls 5 and 6 to designate individually the contents of each cell. This is possible because the leads 10 of the components 3 are much thinner than the body of the components so that even with the cells filled to capacity, the leads 10 do not significantly obscure the view of the upper interior walls 2, 5 and 6 of the individual cells.

The depth of the cell as measured from 8 to 9 shall be essentially equal to the length of the component 3, including its axial leads 10 at both ends of the component. If the components are significantly longer than the depth of the cell, there is a danger that the component leads will become bent and that it will be difficult to tell visually which lead is coming from which cell. If the cells are significantly deeper than the components are long, it becomes difficult to grasp the component leads, even with the aid of a pair of needle nose pliers.

The maximum dimension of the opening to each cell, which in this case is the diagonal measurement from 7 to 8, is preferably less than half the length of the component including its lead 10. The problem with larger openings is that in those embodiments that do not contain the wax-containing means described below components can fall over, becoming hard to reach, and may even become jammed sideways in the cells as the cell becomes depleted of components.

Figure 2:
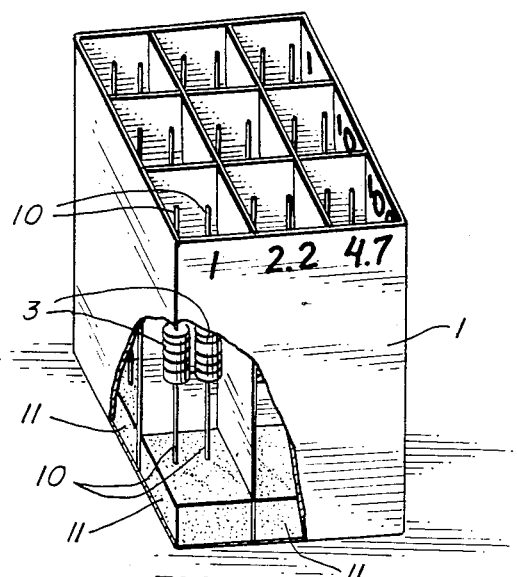
FIG. 2 is identical to FIG. 1 except that the wax retaining means is included in this illustration of the device.

FIG. 2 shows a layer of wax 11 that is located at the bottom of each cell and is used to hold the component leads 10 which are embedded in the wax 11. It is noteworthy that the use of the wax retaining mechanism 11 eliminates the constraint on the maximum dimension of the opening to the cell. This occurs because the wax 11 provides the mechanical support necessary to maintain the vertical position of the components.

Figure 3:
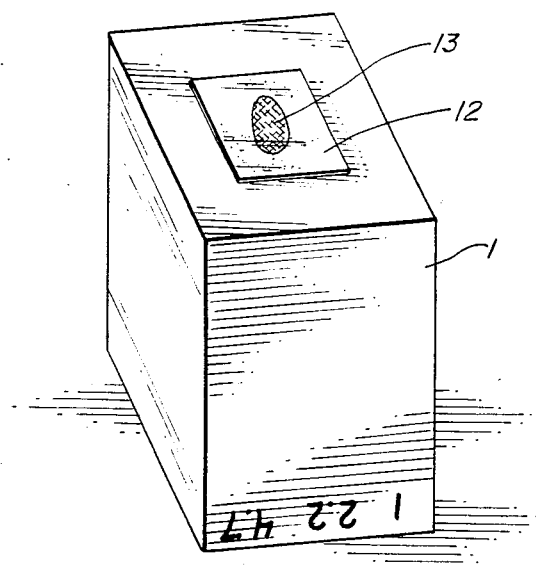
FIG. 3 is the inverted view of the embodiment of FIG. 2 exposing the temperature sensing means.

FIG. 3 shows the temperature sensing means which is used to detect and record any attempt to melt the wax retaining mechanism 11. The means illustrated consists of a temperature sensitive spot 13 which is mounted on a gummed paper carrier 12 that is glued to the bottom of the container 1. The spot 13 includes a substance that irreversibly changes color when the temperature exceeds a preset value, which is chosen to equal or be slightly less than the melting point of the wax retaining means 11.

The above detailed description has been given for clearness of understanding only. No unnecessary limitations should be understood therefrom, as modifications will be obvious to those skilled in the art.

I claim:

1. An array of axial lead components stored in a container from which individual components can be removed as desired, which comprises:

(a) a plurality of axial lead components including at least two portions, each of said portions including only components having a selected parameter, such as resistance, of a particular predetermined value, said value being different from the predetermined value of said selected parameter for the components in each of the other portions of said plurality of components, said components, including the axial leads at both ends of each component, all being elongated in over-all shape and having substantially the same length; and (b) a container including a rectangular box, open on one face and partitioned into a plurality of elongated cells at least equal in number to the number of said portions of said plurality of components, said elongated cells being parallel to each other and at a right angle to the open face of the box, said cells being open at their top ends adjacent to the open face of the box, the depth of each cell being approximately equal to said length of the stored components, each of said cells being filled to a predetermined depth at its closed, bottom end with a wax or wax-like substance previously melted to accept a component lead therein, said wax or wax-like substance having thereafter been solidified around said lead in contact therewith throughout the entire portion thereof previously inserted within said melted material to provide means for retaining said component in said cell, said component being removable manually from said solidified material by gripping the upper lead of the component with a suitable tool held in the user's hand.

2. An array of axial lead components stored in a container as described in claim 1 in which an irreversible temperature indicator is affixed to said container, said indicator being calibrated to change state at a temperature equal to or slightly less than the melting point of said retaining means.

* * * * *